United States Patent [19]

Tagami et al.

[11] Patent Number: 5,057,708
[45] Date of Patent: Oct. 15, 1991

[54] DUPLEX SYSTEM HAVING A FUNCTION TO SUPPRESS RADIO WAVE RADIATION

[75] Inventors: Masateru Tagami, Tokyo; Hirokazu Deguchi, Kawasaki, both of Japan

[73] Assignee: Fujitsu Ltd., Kawasaki, Japan

[21] Appl. No.: 538,409

[22] Filed: Jun. 15, 1990

[30] Foreign Application Priority Data

Jun. 16, 1989 [JP] Japan ................................. 1-152308

[51] Int. Cl.$^5$ ........................ H03K 3/26; H03K 19/00
[52] U.S. Cl. ................................... 307/303; 307/269;
307/480; 307/443; 307/542
[58] Field of Search ................... 307/303, 303.1, 269,
307/480, 244, 242, 443, 542, 89; 328/103;
361/400

[56] References Cited

U.S. PATENT DOCUMENTS

| | | | |
|---|---|---|---|
| 4,185,245 | 1/1980 | Fellinger et al. | 307/269 |
| 4,239,982 | 12/1980 | Smith et al. | 307/269 |
| 4,661,721 | 4/1987 | Ushiku | 307/269 |
| 4,868,414 | 9/1989 | Kanazawa | 307/244 |
| 4,954,929 | 9/1990 | Baran | 361/424 |

Primary Examiner—Stanley D. Miller
Assistant Examiner—Richard Roseen
Attorney, Agent, or Firm—Staas & Halsey

[57] ABSTRACT

Disclosed is a duplex system having a function to suppress radio wave radiation. To suppress unnecessary radiation of radio waves from duplex clock signal lines, the system comprises a plurality of cards each for mounting electronic devices, a backboard for supporting the plurality of cards to be standing closely together in parallel, a first and a second clock signal sources for respectively generating a first and a second clock signals, a first and a second selecting gates for alternatively selecting one of the first and second clock signals to be output, and a first and a second group of clock signal lines, the clock signal lines in the first and second group respectively being wired closely in parallel on the backboard and wired on the cards, for respectively conducting the first and second clock signals to the cards.

21 Claims, 7 Drawing Sheets

PRIOR ART

Fig. 8

DUPLEX SYSTEM HAVING A FUNCTION TO SUPPRESS RADIO WAVE RADIATION

BACKGROUND OF THE INVENTION (1) Field of the Invention

The present invention relates to a duplex system having a function to suppress unnecessary radio wave radiation, and more particularly to a duplex system comprising a plurality of cards each having electronic parts mounted thereon, a backboard supporting the plurality of cards standing close together in parallel, a plurality of clock signal lines wires closely in each card, and duplex clock signal sources for outputting the duplex clock signals.

In recent years, a method of reducing Electro Magnetic Interference (EMI) for suppressing the radiation of unnecessary electromagnetic waves has been desired. This is because radio wave radiated from electronic devices and their peripheral devices induce noises in other electronic devices so that erroneous operations will occur in these other electronic devices.

To prevent these erroneous operations, rules have been established in some countries such as in the United States of America and in European countries, or voluntary controls are imposed in certain industrial fields, as conducted in Japan. Under these rules or restrictions, the radiation limit of the radio wave is practically determined.

The present invention relates to the suppression of unnecessary radio wave radiation as described above.

(2) Description of the Related Art

In a conventional duplex system comprising a plurality of cards each having electronic parts mounted thereon, a backboard for supporting the plurality of cards standing close together in parallel, a plurality of clock signal lines wired closely in parallel on the backboard for supplying clock signals to each card, and duplex clock signal sources for outputting the duplex clock signals, there is no countermeasure to suppress unnecessary radiation of radio waves so that the unnecessary radiation of radio waves is generated in an amount over that allowed by the above-mentioned rules or restrictions.

In particular, when a high frequency clock signal of, for example, several mega hertz to several tens of megahertz is employed, its higher harmonics are easily radiated from the backboard or the cards.

SUMMARY OF THE INVENTION

In view of the above problems in the conventional art, an object of the present invention is to provide a duplex system having a function to suppress unnecessary radiation of radio waves to the external world.

To attain the above object, there is provided, according to one aspect of the present invention, a duplex system having a function to suppress radio wave radiation as follows. A plurality of cards, each having electronic devices mounted thereon is provided on a backboard for supporting the cards so that the cards closely together in parallel. First and second clock signal sources for respectively generating first and second clock signals are connected to first and second selecting gates, respectively, for alternatively selecting one of the first and second clock signals to be output. A first and a second group of clock signal lines are connected to the outputs of the first and second selecting gates respectively and wired closely in parallel on the backboard and wired on the cards, for respectively conducting the first and second clock signals to the cards.

According to another aspect of the present invention, there is provided a duplex system having a function to suppress radio wave radiation as follows: A plurality of cards, each having electronic devices mounted thereon, is provided on a backboard for supporting the plurality of cards to be standing closely together in parallel. First and second clock signal sources for respectively generating a first and a second clock signals are mounted on at least one of the cards arranged centrally on the backboard. A first and a second group of clock signal lines are operatively connected to the outputs of the first and second clock signal sources respectively and wired closely in parallel on the backboard and wired on the cards, for respectively conducting the first and second clock signals to the cards.

BRIEF DESCRIPTION OF THE DRAWINGS

The above object and features of the present invention will be more apparent from the following description of the preferred embodiment with reference to the attached drawings, wherein.

DESCRIPTION OF THE PREFERRED EMBODIMENTS

Throughout the description, the same reference numerals represent the same parts.

For better understanding of the present invention, the background art and the conventional art will first be described with reference to FIGS. 1 and 2.

Figure 1:
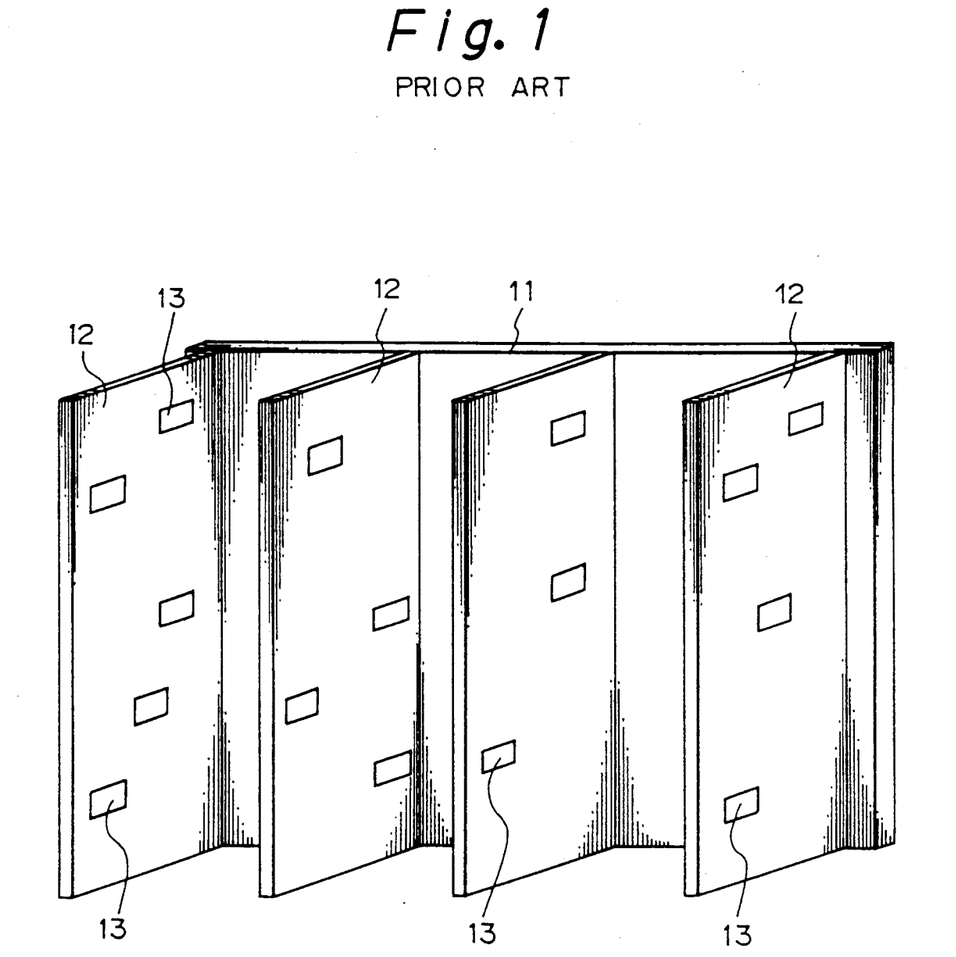
FIG. 1 is a perspective view of a plurality of cards supported on a backboard, as a background of the present invention.

FIG. 1 is a perspective view of a plurality of cards supported on a backboard, as a background of the present invention. In the figure, a plurality of cards 12 are supported by a backboard 11. On each card 12, electronic parts 13 are mounted. The cards 12 stand close together in parallel. Such a device arrangement is generally known in, for example, line circuits and trunk circuits in an exchange equipment.

Figure 2:
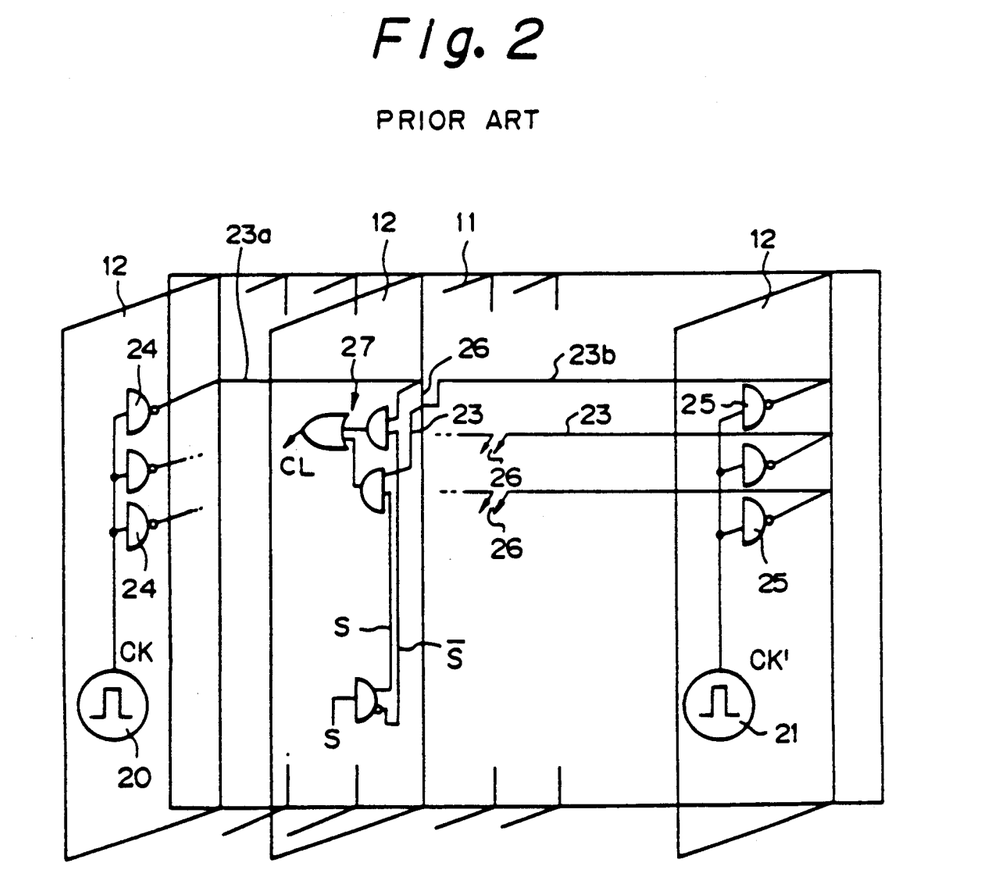
FIG. 2 is a circuit diagram of a conventional duplex system.

FIG. 2 is a circuit diagram of a conventional duplex system. The duplex system shown in FIG. 2 is formed in the device arrangement shown in FIG. 1. The duplex system relates to a clock signal transferring system. Generally, the frequency of the clock signal is as high as several MHz to several tens of MHz so that its higher harmonics cause unnecessary radiation of noises. In the figure, 20 is a 0-system clock signal source which is provided on the far left-hand side card, and 21 is a 1-system clock signal source which is provided on the far right-hand side card. Usually, one of the clock systems is in an active state (ACT) and another one of the clock system is in a standby state (SBY). The clock signal generated by the 0-system clock signal source 20 is supplied to the cards through a plurality of buffers circuit 24 provided to correspond to respective cards. Likewise the clock signal generated by the 1-system clock signal source 21 is supplied to the cards through a plurality of buffer circuits 25 provided to correspond to respective cards. A plurality of clock signal lines 23a conduct the clock signal from the buffer circuits 24 to the respective cards. A plurality of clock signal lines 23b conduct the clock signal from the buffer circuits 25 to the respective cards. The clock signal lines 23a are wired closely and in parallel on the backboard 11. Also, the clock signal lines 23b are wired closely and in parallel on the backboard 11. 26 is an input portion of the clock signal lines 23a and 23b in each card 12.

The clock signal from the 0-system clock signal source 20 and the clock signal from the 1-system clock signal source 21 are both supplied to the input portion 26 of each card 12. One of these clock signals is selected to be used. In the prior art, the selection is performed by a gate circuit 27 which is provided on each card 12. The gate circuit 27 consists of two AND gates and an OR gate. One of the two AND gates has a first input end for receiving the clock signal of the 0-system. Another one of the two AND gates has a first input end for receiving the clock signal of the 1-system. The outputs of the two AND gates are connected to the inputs of the OR gate. To the second input ends of the two AND gates, complementary selecting signals S and $\bar{S}$ are applied. The signal S is the same as the external selecting signal S. The signal $\bar{S}$ is an inverted signal of the signal S. Depending on the external selecting signal S, either one of the two AND gates passes the clock signal from the clock signal source 20 and 21. Thus, the clock signal CL is obtained at the output of the OR gate.

In the above-mentioned conventional duplex system, there is no countermeasure to suppress unnecessary radiation of radio waves so that radiation of radio waves is greater than that allowed by the above-mentioned rules or restrictions.

In particular, when a high frequency clock signal of, for example, several megahertz to several tens of megahertz is employed, its higher harmonics are easily radiated from the backboard or the cards.

Embodiments of the present invention will now be described.

Figure 3:
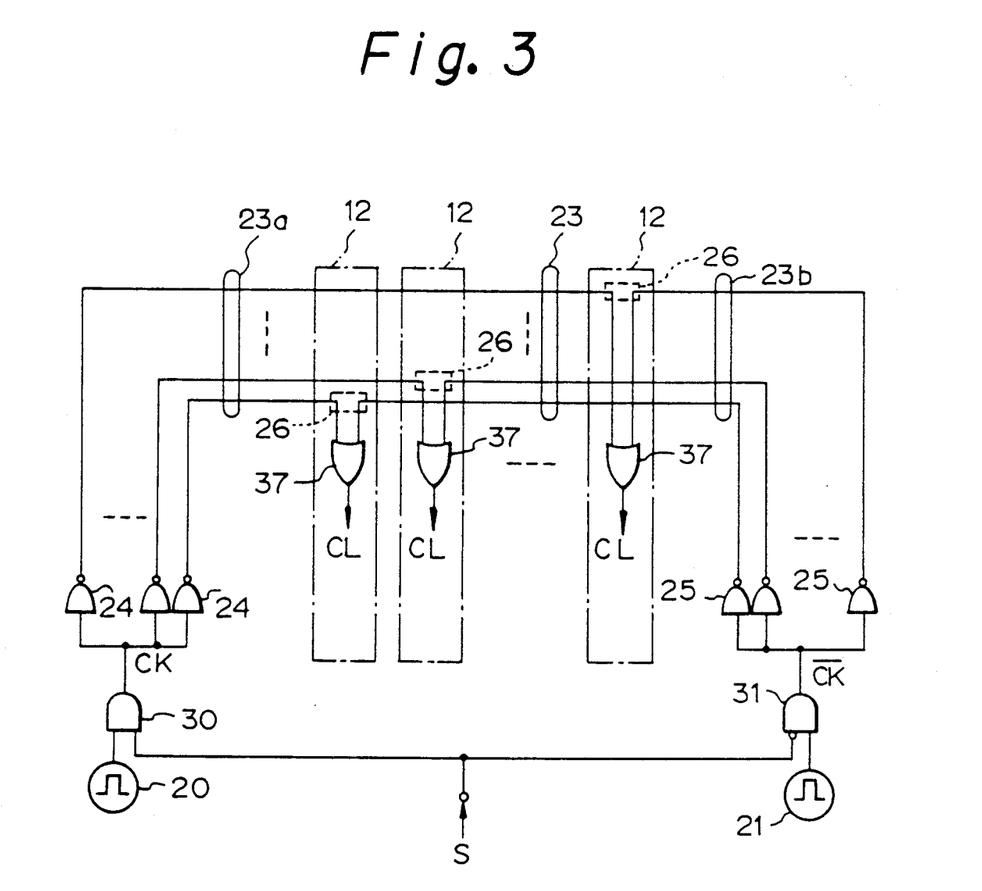
FIG. 3 is a circuit diagram of a duplex system according to the first principle of the present invention.

FIG. 3 is a circuit diagram of a duplex system according to the first principle of the present invention. The difference between the circuit diagram in FIG. 2 and the circuit diagram in FIG. 3 is that, in FIG. 3, a pair of gate circuits 30 and 31 are connected to clock signal sources 20 and 21. The gate circuit 30 is an AND gate having a first input end for receiving the 0-system clock signal 20 and a second input end for receiving a selecting signal S. The gate circuit 31 has a first input end for receiving the 1-system clock signal 21 and a second input end which is an inverting input end for receiving the selecting signal S. The output end of the gate circuit 30 is connected to the input ends of the buffer circuits 24 which are provided to correspond to the respective cards. Also, the output end of the gate circuit 31 is connected to the input ends of the buffer circuits 25 which are provided to correspond to the respective cards. Each card 24 has an OR gate 37. The outputs of the buffer circuits 24 are connected through the 0-system clock signal lines 23a and the input portions 26 to the first input ends of the OR gates 37, and the outputs of the buffer circuits 25 are connected through the 1-system clock signal lines 23b and the input portions 26 to the second input ends of the OR gates 37.

As will be described, when one of the clock signals supplied by gate circuits 30 or 31 is on standby, the supply of that signal is stopped on the backboard so that a phase difference between the different clock signals is not generated and thereby noise is suppressed.

It is preferably to maintain the potential level of the clock signal line connected to the input end of the non-selected gate circuit 30 or 31 to be a fixed level such as ground level, whereby the crosstalk between adjacent lines can be suppressed.

Figure 4:
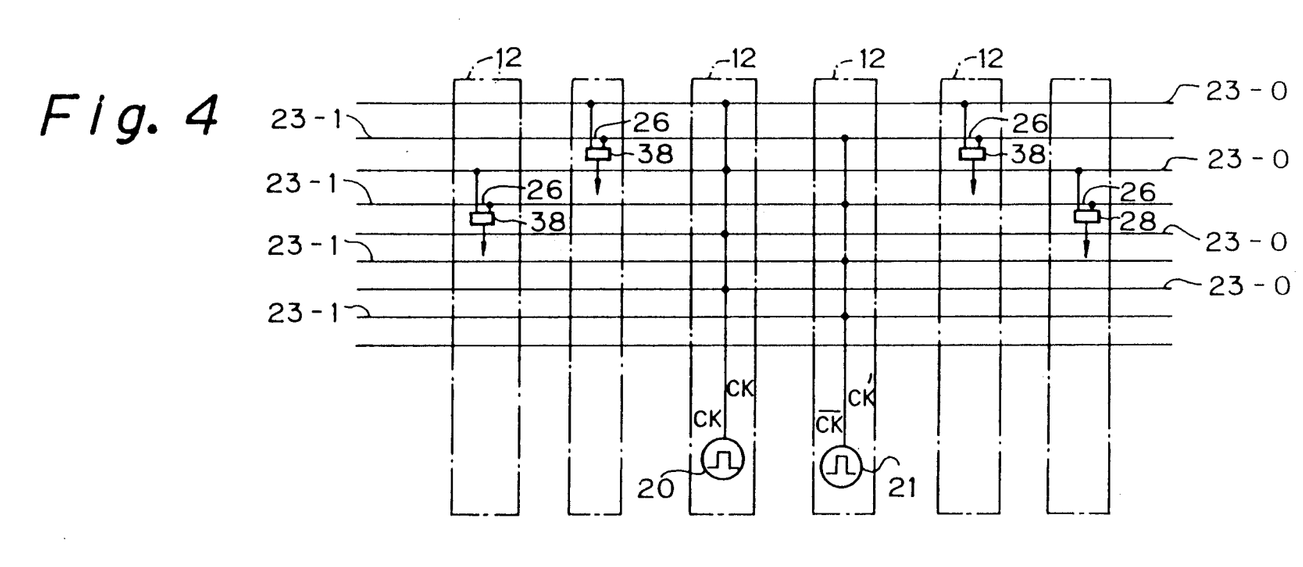
FIG. 4 is a circuit diagram of a duplex system according to the second principle of the present invention.

FIG. 4 is a circuit diagram of a duplex system according to the second principle of the present invention. In FIG. 4, a plurality of pairs of 0-system clock signal lines 23-0 and 1-system clock signal lines 23-1 extend in parallel across the plurality of cards 12. Each pair of lines 23-0 and 23-1 corresponds to one card 12.

Further, the 0-system clock signal source 20 and the 1-system clock signal source 21 are provided on one or two cards positioned at an approximately central location among the plurality of cards. These sources may be provided on one card or may be separately provided on two adjacent cards at an approximately central location as illustrated in FIG. 4.

Still further, the potential level of the clock signal line of the standby system may be maintained at ground level in the same way as in the first principle.

The idea of the present invention is based on the discovery of the following problems in the prior art. Namely, in the conventional construction of the clock system shown in FIG. 2, the interference between clock signals CK and CK' due to crosstalk and so forth are greater at the portion near both ends of the clock signal lines so that noises including higher harmonics are easily generated near both ends, because these interferences are increased when there is a phase difference between the 0-system clock signal and the 1-system clock signal.

Figure 5A:
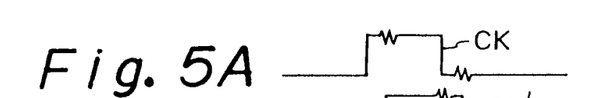
FIGS. 5A and 5E are diagrams showing noises generated by interference from clock signals.
Figures 5B, 5C, 5D:
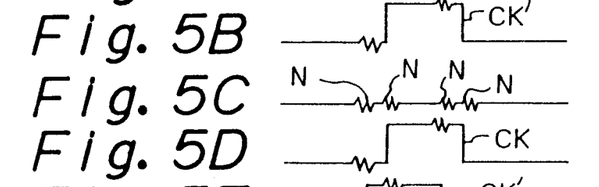
Figure 5E:
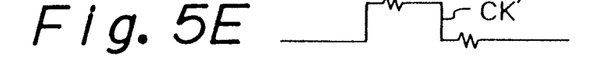

FIGS. 5A and 5E are waveform diagrams showing the generation of noises due to crosstalk between the clock signals CK and CK'. As shown in FIGS. 5A and 5B, or in FIGS. 5D and 5E, noises are generated when there is a phase difference between the clock signal CK and CK'. In FIG. 5C, N represents the noises. The phase difference is larger on the cards 12 positioned at both ends of the backboard 11, because there is a longer delay of the clock signal through the clock-signal line from one end to the other of the backboard 11. Namely, on the card close to the clock signal source 20 generating the clock signal CK, there is a phase difference between the clock signal CK and the clock signal CK' which is transferred from the other end of the backboard 11, as shown in FIGS. 5A and 5B. On the contrary, on the card close to the clock signal source 21 generating the clock signal CK', there is a phase difference between the clock signal CK' and the clock signal CK which is transferred from the other end of the backboard 11, as shown in FIGS. 5D and 5E. In both cases, noises N are generated as shown in FIG. 5C.

Further, when the clock signal line is longer, the frequency of harmonics resonant with the clock signal line becomes lower so that unnecessary radio waves are easily radiated from the clock signal line.

In view of the above facts, according to the first principle of the present invention shown in FIG. 3, when one of the clock signals CK and CK' is used for the active system (ACT), the supply of the other clock signal for the standby system (SBY) is stopped on the backboard 11. Thereby, the above-mentioned phase difference between the 0-system clock signal and the 1-system clock signal is not generated so that the generation of the noises N is suppressed.

As mentioned before, it is preferably to maintain the potential level of the clock signal line connected to the clock signal source which does not supply the clock signal to be at ground level. This is usually realized automatically since the output level of the buffer circuit 24 or 25 which belongs to the standby system outputs the logical "L" level which is usually ground level. If the buffer circuit 24 or 25 is not constructed as above, it may be realized by connecting the 0-system clock signal line and the 1-system clock signal line through ON/OFF gates (not shown in the figure) to ground, and by turning on the ON/OFF gate connected to the clock signal line of the standby system.

By maintaining the clock signal line of the standby system to be at ground level, the crosstalk can be suppressed and therefore the effect to suppress the unnecessary radio wave radiation can be obtained. Generally, the following expression is known:

$$E \text{-} I \cdot A \cdot f^2$$

where E is the electric field intensity; I is the clock signal current; A is the area of the loop determined by the flow of the clock signal from the clock signal source through the clock signal line and earth close to the clock signal line to return back to the clock signal source; and f is the clock signal frequency. Then, when the potential level of the clock signal line of the standby system is maintained at ground level as mentioned before, the area A in the above expression is made half of that shown in the conventional arrangement shown in FIG. 2. As a result, the electric field intensity E is lowered and the noises are suppressed.

Next, in view of the fact that noises are generated due to a phase difference between the clock signals, according to the second principle of the present invention shown in FIG. 4, the phase difference is not produced at the point or origin. Referring to FIG. 4 again, the clock signals CK and CK' are transferred in parallel through the clock signal lines 23-0 and 23-1 from the center card to both ends of the backboard 11 at the same speed. Therefore, the transfer delay of the clocks signal CK is almost the same as that of the clock signal CK' at any point on the clock signal lines 23-0 and 23-1 so that there is no phase difference between the clock signals CK and CK' at each card. As a result, noise is not generated in this embodiment.

In the second principle of the present invention shown in FIG. 4, the idea of the first principle may be introduced. Namely, when the clock signal of the active system is CK for example, only the clock signal CK is changed to the active state and the clock signal CK of the standby state is changed to the inactive state and to ground level. The, each clock signal line 23-0 through which the clock signal CK of the active state is transferred is surrounded by the clock signal lines 23-1 at ground level so that the crosstalk is suppressed, resulting in a noise suppressing effect. In addition, by providing both sources 20 and 21 centrally as shown in FIG. 4, the area A in the already mentioned expression $E \propto I \cdot A \cdot f^2$ is decreased to half of that shown in FIG. 3. Therefore, the unnecessary radiowave radiation is suppressed effectively.

In FIG. 3, 26 illustrates the already mentioned input portions to which OR gates 37 are connected. Contrary to the conventional gate circuits 27 shown in FIG. 2, only the OR gates 37 are provided because the selecting signals S and S' are not provided to each card in this principle.

In FIG. 4 also, gate circuits 38 are connected to the input portions 26. Each of the gate circuits 38 is realized by the OR gate 37 shown in FIG. 3, or the gate circuit 27 in FIG. 2. Namely, when the %0-system clock signal CK and the 1-system clock signal CK' are both used in the active state, the gate circuit 27 is used for the gate circuit 38; and when complementary clock signals CK and CK' are used, the OR gate 37 is used for the gate circuit 38.

Figure 6:
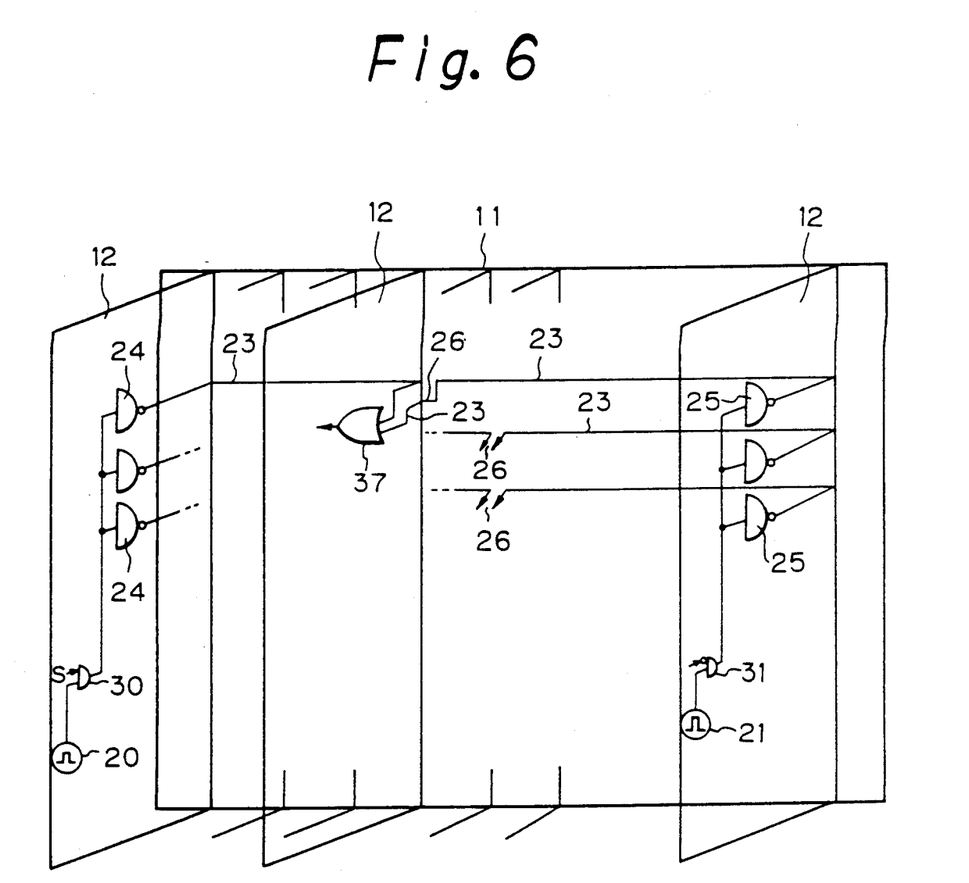
FIG. 6 is a circuit diagram of a duplex system according to an embodiment of the first principle of the present invention.
Figure 7:
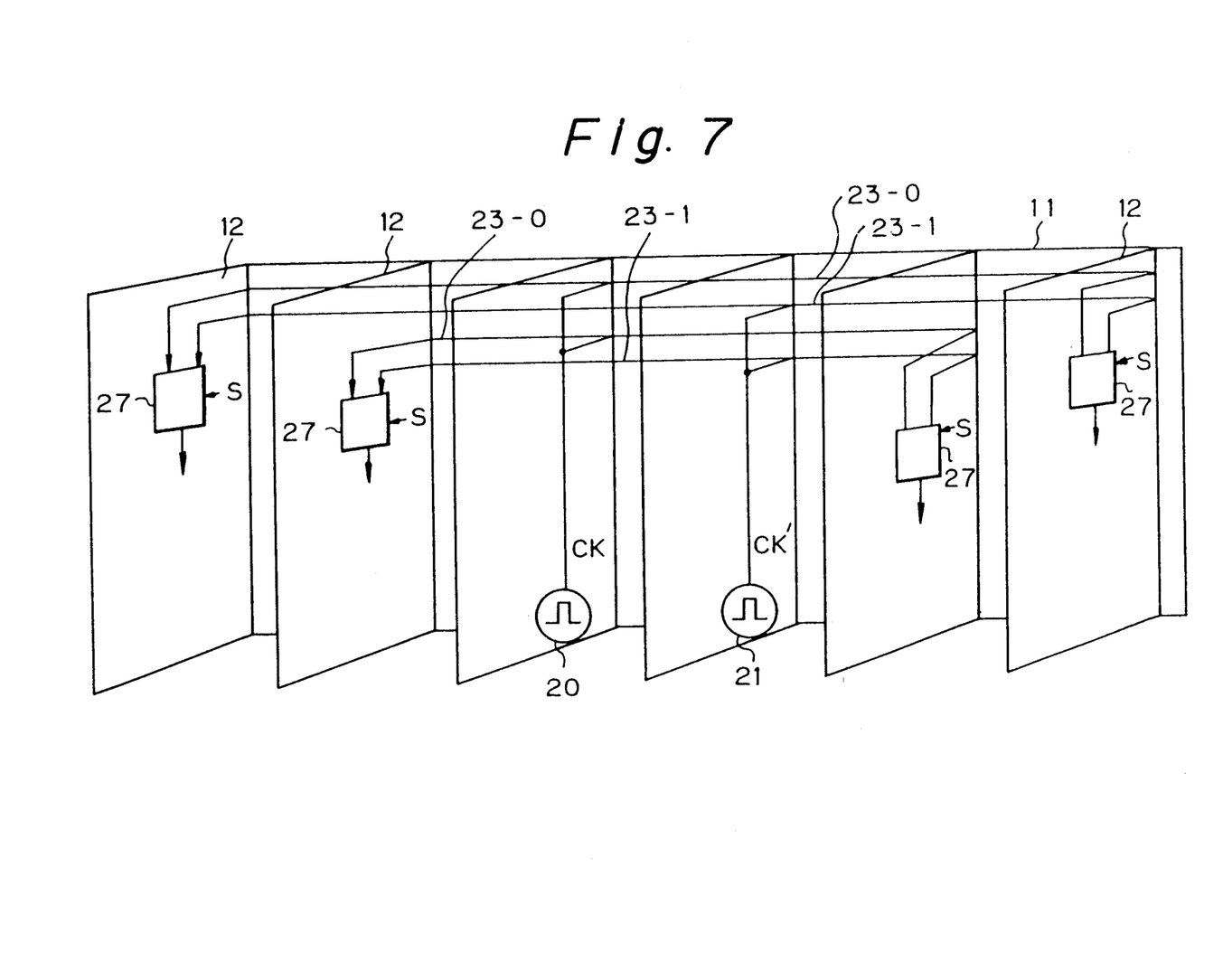
FIG. 7 is a circuit diagram of a duplex system according to a first embodiment of the second principle of the present invention.

FIG. 6 is a circuit diagram of a duplex system according to an embodiment of the first principle of the present invention; FIG. 7 is a circuit diagram of a duplex system according to a first embodiment of the second principle of the present invention; and FIG. 8 is a circuit diagram of a duplex system according to a second embodiment of the second principle of the present invention.

In FIG. 6, the circuit construction is the same as that shown in FIG. 3, and the cards 12 are perspectively shown on the backboard 11. The gate circuits 30 and 31 are selecting gates for selecting the clock signal 20 or 21 in response to a selecting signal S.

In FIG. 7, the circuit construction is the same as that shown in FIG. 4, and the cards 12 are perspectively shown on the backboard 11. The gate circuits 27 are the same as the gate circuits 27 in FIG. 2. The gate circuits 27 select the clock signals CK or CK' in response to a selecting signal.

Figure 8:
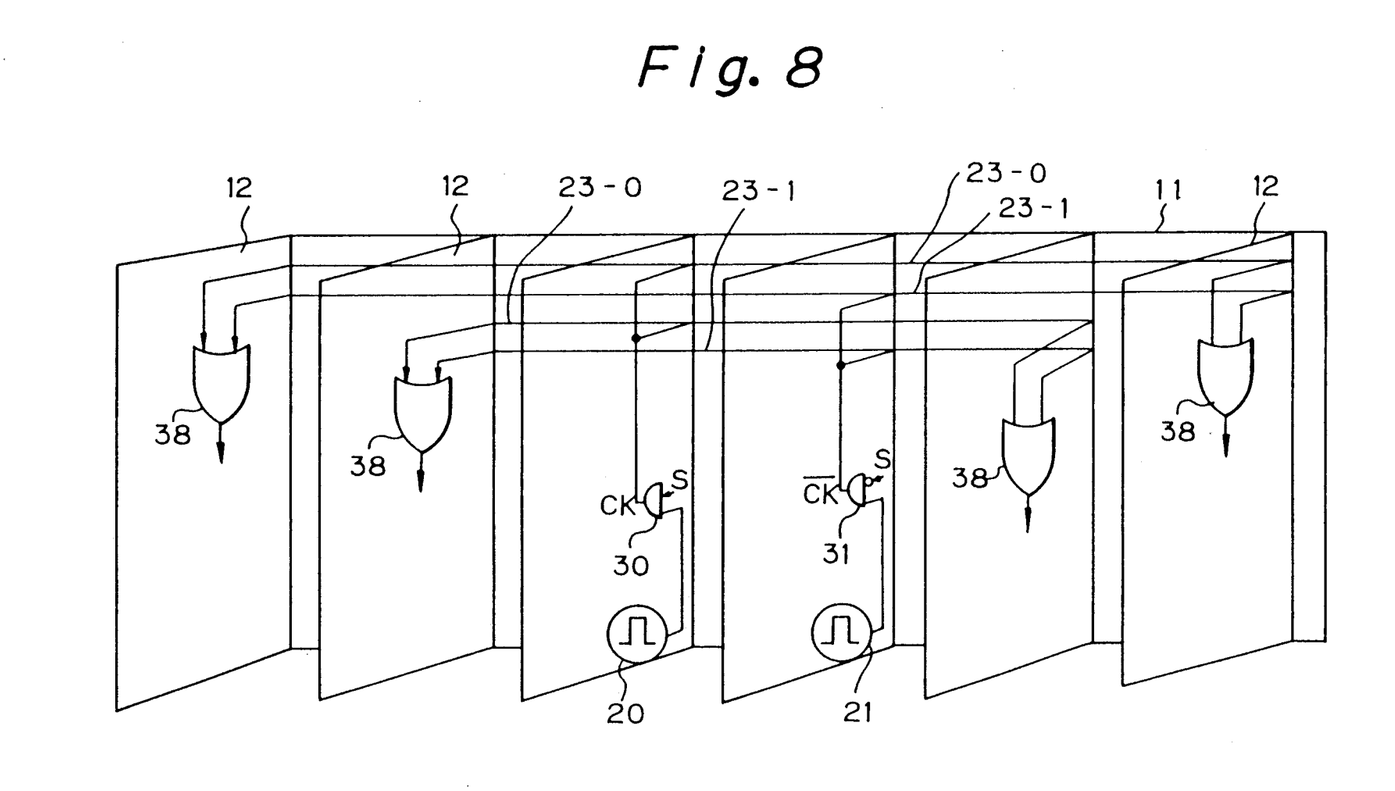
FIG. 8 is a circuit diagram of a duplex system according to a second embodiment of the second principle of the present invention.

In FIG. 8, the circuit construction is the same as that shown in FIG. 4, and the cards 12 are perspectively shown on the backboard 11. The gate circuits 38 are the OR gates for passing the active clock signal CK or CK, while the standby clock signal is maintained at ground level.

From the foregoing description, it will be apparent that, according to the present invention, radiation of unnecessary radio waves due to duplex clock signals can be suppressed without greatly changing the system design of the existing duplex system and by only replacing a part of the hardware of the duplex system.

We claim:

1. A duplex system having a function to suppress radio wave radiation, comprising:
    cards, each for mounting electronic devices;
    a backboard, having a first end and a second end, for supporting said plurality of cards which stand closely together in parallel;
    first and second clock signal sources respectively generating first and second clock signals;
    first and second selecting gates, operatively connected to said first and second clock signal sources respectively, having outputs and alternatively selecting one of said first and second clock signals to be output; and
    a first and a second group of click signal lines, operatively connected to the outputs of said first and second selecting gates respectively, the clock signal lines in said first and second groups respectively being wired closely in parallel on said backboard and wired on said cards, for respectively conducting said first and second clock signals to said cards.

2. A duplex system as claimed in claim 1, wherein said first and second clock signal sources are duplex clock signal sources mounted on two of said cards arranged at both ends of said backboard.

3. A duplex system as claimed in claim 1, wherein said pair of selecting gates are mounted on two of said cards arranged at both ends of said backboard.

4. A duplex system as claimed in claim 1, wherein said first and second clock signal lines have a potential level, said first and second selecting gates include a nonselecting gate, and the potential level of the clock signal lines connected to the output of the nonselecting gate is maintained at a fixed level.

5. A duplex system as claimed in claim 4, wherein said fixed level is a ground level.

6. A duplex system as claimed in claim 1, wherein the said first group of clock signal lines are respectively connected to said cards, and said second group of the clock signal lines in said second group are respectively connected to said cards.

7. A duplex system as claimed in claim 1, further comprising a first and a second group of buffer circuits, operatively connected between the outputs of said first and second selecting gates and said first and second group of clock signal lines, for amplifying the clock signal selected by one of said first and second selecting gates.

8. A duplex system as claimed in claim 1, further comprising a plurality of OR gates, respectively mounted on said cards, each having a first input end connected to an active clock signal line and a second input end connected to a standby clock signal line, said active clock signal line and said standby clock signal line being determined by said pair of selecting gates.

9. A duplex system having a function to suppress radio wave radiation, comprising:
cards, each for mounting electronic devices;
a backboard for supporting said cards which stand closely together in parallel;
first and second clock signal sources for respectively generating first and second clock signals, said first and said second clock signal sources having outputs and being mounted on at least one of said cards located centrally on said backboard; and
a first and a second group of clock signal lines, operatively connected to the outputs of said first and second clock signal sources respectively, the clocks signal lines in said first and second groups respectively being wired closely in parallel on said backboard and wired on said cards, for respectively conducting said first and second signals to said cards.

10. A duplex system as claimed in claim 9, wherein said first and said second clock signal sources are mounted on two of said cards arranged centrally on said backboard.

11. A duplex system as claimed in claim 9, further comprising a plurality of selecting gates respectively mounted on said cards, each of said selecting gates having a first input end for receiving said first clock signal through one of said first clock signal lines and having a second input end for receiving said second clock signal through one of said second clock signal lines, for selecting one of said first and second clock signals to be output.

12. A duplex system as claimed in claim 9, further comprising first and a second selecting gates, operatively and respectively connected between said first and second clock signal sources and said first and second group of clock signal lines, for alternatively selecting one of said first and second clock signals to be output to one of said first and second groups of clock signal lines.

13. A duplex system as claimed in claim 12, wherein a potential level of the clock signal lines connected to the output of the nonselecting gate are maintained at a fixed level.

14. A duplex system as claimed in claim 13, wherein said fixed level is a ground level.

15. A duplex system as claimed in claim 14, further comprising a plurality of OR gates, respectively mounted on said cards, each having a first input end connected to an active clock signal line and a second input end connected to a standby clock signal line, said active clock signal line and said standby clock signal line being determined by said first and second selecting gates.

16. A gate control system in a duplex system having cards on which electronic devices are mounted, clock signal sources generating clock signals, and clock signal lines conducting the clock signals to the cards, comprising:
selecting gates, operatively connected to the clock signal lines, connected and adjacent to the clock signal sources and selecting one of the clock signal sources to conduct clock signals to the cards by the clock signal lines.

17. A duplex system as claimed in claim 16, wherein the clock signal lines connected to a clock signal source that are not selected are maintained at a fixed level.

18. A duplex system as claimed in claim 17, wherein the fixed level is a ground level.

19. A duplex system as claimed in claim 16, wherein the cards are provided in parallel, and the clock signal sources are provided on one of a card and adjacent cards located centrally among the cards.

20. A duplex system as claimed in claim 17, wherein the cards are provided in parallel, and the clock signal sources are provided on one of a card and adjacent cards located centrally among the cards.

21. A method of suppressing radio wave radiation in a duplex system, having clock signal sources generating clock signals and clock signal lines conducting the clock signals to the cards, comprising the step of:
(a) selecting one of the clock signal sources to conduct clock signals to the cards by the clock signal lines; and
(b) maintaining the clock signals generated by unselected clock signal sources at a fixed level.

* * * * *

UNITED STATES PATENT AND TRADEMARK OFFICE
CERTIFICATE OF CORRECTION

PATENT NO. : 5,057,708
DATED : October 15, 1991
INVENTOR(S) : Tagami, et. al.

It is certified that error appears in the above-indentified patent and that said Letters Patent is hereby corrected as shown below:

Col. 1, line 13, after "in" insert --parallel on the backboard for supplying clock signals to--.

Col. 4, line 13, "preferably" should be --preferable--.

Col. 5, line 12, "preferably" should be --preferable--;
line 30 "E-1" should be --E$\alpha$ 1--.

Col. 6, line 15, "delete "%";
line 67, "click" should be --clock--.

UNITED STATES PATENT AND TRADEMARK OFFICE
CERTIFICATE OF CORRECTION

PATENT NO. :  5,057,708
DATED      :  October 15, 1991
INVENTOR(S) : Tagami et al.

It is certified that error appears in the above-identified patent and that said Letters Patent is hereby corrected as shown below:

Col. 7,  line 10, after "said" insert --first--;
line 11, "pair of" should be --and second--;
line 15, delete entire line;
line 16, delete "ing gate,";
line 17, "the nonselecting" should be --a nonselected--;
line 40, "pair of" should be --first and second--;
line 57, after "second" insert --clock--.

Col. 8,  line 19, "the nonselecting" should be --a nonselected--;
line 57, "the cards" should be --cards having electronic devices mounted thereon--.

Signed and Sealed this

Nineteenth Day of October, 1993

Attest:

BRUCE LEHMAN

Attesting Officer       Commissioner of Patents and Trademarks